United States Patent
Deng et al.

(10) Patent No.: US 6,755,151 B2
(45) Date of Patent: Jun. 29, 2004

(54) HOT-FILAMENT CHEMICAL VAPOR DEPOSITION CHAMBER AND PROCESS WITH MULTIPLE GAS INLETS

(75) Inventors: Xunming Deng, Sylvania, OH (US); Henry S. Povolny, Elmore, OH (US)

(73) Assignee: The University of Toledo, Toledo, OH (US)

( * ) Notice: Subject to any disclaimer, the term of this patent is extended or adjusted under 35 U.S.C. 154(b) by 0 days.

(21) Appl. No.: 10/616,873

(22) Filed: Jul. 10, 2003

(65) Prior Publication Data

US 2004/0106269 A1 Jun. 3, 2004

Related U.S. Application Data

(62) Division of application No. 10/205,481, filed on Jul. 25, 2002, now Pat. No. 6,638,839.
(60) Provisional application No. 60/308,014, filed on Jul. 26, 2001.

(51) Int. Cl.[7] .............................................. C23C 16/00
(52) U.S. Cl. .......................... 118/723 MC; 118/723 E; 118/733
(58) Field of Search ...................... 118/723 MC, 723 E, 118/50.1, 733; 438/795

(56) References Cited

U.S. PATENT DOCUMENTS

| | | |
|---|---|---|
| 5,082,359 A | 1/1992 | Kirkpatrick |
| 5,397,737 A | 3/1995 | Mahan et al. |
| 5,776,819 A | 7/1998 | Mahan et al. |
| 6,124,186 A | 9/2000 | Molenbroek et al. |
| 6,214,706 B1 | 4/2001 | Madan et al. |
| 6,251,183 B1 | 6/2001 | Iwancizko et al. |
| 6,427,622 B2 | 8/2002 | Madan et al. |

OTHER PUBLICATIONS

H. Povolny, S. Han, X.B., Xiang and X. Deng/Hot–Wire Deposition of c–Si and a–Si Using Different Gas Excitations By A Coiled Filament/Abstract submitted to 19th International Conference Amorphous and Microcrystalline Semiconductors Science and Technology (ICAMS19) Acropolis Center, Nice, France, Aug. 27–31, 2001.

Xunming Deng/Construction of a novel hot–wire deposition system employing a coiled hot filament/Disclosed at "Amorphous Silicon Team Meeting" for NREL/DOE (Nat'l Renewable Energy Laboratory/Dept. of Energy) in Aug. 2000.

S. Yu, E. Gulari, and J. Kanicki/Center for Diaplay Technology and Manufacturing, University of Michigan, Ann Arbor, Michigan 48109/Selective deposition of polycrystalline silicon thin films at low temperature by hot–wire chemical vapor deposition/May 1996.

Mitsuru Ichikawa, Jun Takeshita, Akira Yamada and Makoto Konagai/Dept. of Electrical and Electronic Engineering, Tokyo, Japan/Jpn. J. Appl. Phys. vol 38 (1999) pp. L24–L26, Part 2, No. 1A/B, Jan. 15, 1999, ©1999 Publication Board, Japanese Journal of Applied Physics/Jan. 1999.

*Primary Examiner*—Alexander Ghyka
(74) *Attorney, Agent, or Firm*—Emch, Schaffer, Schaub & Porcello Co., L.P.A.

(57) ABSTRACT

A thin film deposition method uses a vacuum confinement cup that employs a dense hot filament and multiple gas inlets. At least one reactant gas is introduced into the confinement cup both near and spaced apart from the heated filament. An electrode inside the confinement cup is used to generate plasma for film deposition. The method is used to deposit advanced thin films (such as silicon based thin films) at a high quality and at a high deposition rate.

14 Claims, 2 Drawing Sheets

HOT-FILAMENT CHEMICAL VAPOR DEPOSITION CHAMBER AND PROCESS WITH MULTIPLE GAS INLETS

CROSS-REFERENCE TO RELATED APPLICATION

This is a division of Ser. No. 10/205,481 filed Jul. 25, 2002, now U.S. Pat. No. 6,638,839, which claims the benefit of provisional application Ser. No. 60/308,014 filed Jul. 26, 2001, which is hereby expressly incorporated herein by reference.

The present invention was made under research grants from the National Renewable Energy Laboratory/US Department of Energy, under Contract or Grant No(s). ZAF-8-17619-14, ADD-8-18669-08, and NDJ-2-30630-08who may have certain rights thereto.

FIELD OF THE INVENTION

The present invention relates to a new thin film deposition method and a new deposition apparatus that employs a heated coiled filament and multiple gas inlets. At least one inlet directs at least one type of suitable reactant gas, or gases, into a gas confinement cup contained with a chamber such that the gases pass through the heated coiled filament. The method of the present invention is used to deposit advanced thin films at both a high quality and at high deposition rate. Hot-filament process is used to deposit semiconductor materials with improved materials properties onto desired substrates.

BACKGROUND OF THE INVENTION

Thin film semi-conductors are useful in a variety of electronic devices such as solar panels, liquid crystal displays and other related technologies. One method for making these thin semi-conductors, such as amorphous silicon or microcrystalline silicon, is to deposit a thin film onto a suitable substrate using a chemical vapor deposition (CVD) process. The most commonly used CVD method to deposit amorphous or microcrystalline silicon is plasma enhanced chemical vapor deposition (PECVD). However, such a PECVD method leads to low rate of film deposition.

An alternative chemical vapor deposition process that leads to a higher deposition rate is a hot-wire chemical vapor deposition (HW CVD) process which uses a thin foil or small metal diameter wire filament as the hot-element of the process. The element, which can comprise tungsten, tantalum or molybdenum, for example, is heated to a high temperature and a gas is caused to flow over or into contact with the hot filament. The hot filament breaks down the gas into its constituents. These constituents then are deposited on an adjacent substrate.

However, there are many drawbacks associated with these conventional hot-wire chemical vapor deposition processes. Several groups have studied the use of hot-wire CVD process to deposit advanced thin films such as amorphous silicon based films. Mahan et al. (U.S. Pat. Nos. 5,397,737, 5,776,819), Iwancizko et al. (U.S. Pat. No. 6,251,183), Madan et al. (U.S. Pat. No. 6,214,706), and Molenbroek at al. (U.S. Pat. No. 6,124,186) deposited films using a hot-wire process that employs a wire spanning within the chamber to dissociate gases introduced into the chamber. However, the rate of deposition for this method is typically less than 50 A/sec. In addition, due to the lack of high controllability of the concentration of radicals, these methods have failed to produce amorphous silicon based solar cells with efficiency comparable to state-of-the-art solar cells produced using PECVD method.

Ichikawa M., Takeshita, J., Yamada, A., and Kongal, M., Jpn J. Appl. Phys. 38, L24 (1999) used a coiled hot-filament near the gas inlet to deposit polycrystalline silicon and microcrystalline silicon materials. Although such a filament design could, in theory, lead to a higher deposition rate, it has failed to be used to produce photovoltaic devices with reasonable efficiency. This is again due to the lack of sufficient control of the concentrations of reactive species in the reactor. For example, during the deposition of amorphous silicon, there are significant amounts of the Si, SiH, and $SiH_2$ species in the mixture, while the species responsible for high-quality film is believed to be the SiH3 species.

Yu, S., Gulari, E., and Kanicki, J., Appl. Phys. Lett, 68, 2681 (1996) used a filament spanning inside the chamber plus a gas dispersal ring closer to the substrate to deposit large-grain size polycrystalline silicon for application in flat panel displays. However, high quality film suitabl for flat panel display device application or photovoltaic application could not be demonstrated using this method. As indicated above, all of these methods do not allow practioners to achieve high controllability of the concentration of radicals, and, therefore are difficult to use to produce high quality thin film materials such as amorphous silicon based materials for high-efficiency photovoltaic applications. Further, the rates of deposition that are achieved using HW CVD with span filaments inside the chamber are not sufficiently acceptable, and therefore, add to the cost of manufacturing useful products.

Therefore, there is needed in the art of hot-wire chemical vapor deposition processes a method and an apparatus which provide improved deposition results and at an increased deposition rate.

There is a further need to provide a method and an apparatus to increase the efficiency of deposition of a desired element onto a substrate.

There is a further need for an apparatus which avoids contamination during the deposition process.

Further, there is a need for a commercially practical hot-wire chemical vapor deposition process which is reliable in a manufacturing setting.

It is also desirable to have an improved method to produce amorphous silicon and microcrystalline silicon products having improved properties.

DESCRIPTION OF THE INVENTION

This invention relates generally to apparatus and method for hot-filament chemical vapor deposition of thin film material onto a substrate, and more particularly, to a novel apparatus and method for depositing advanced thin films and coatings for use in a broad range of applications including photovoltaic devices, thin film transistors, as color plasma display panels and hard coatings for tools.

Until the present invention, no one had thought to combine the advantages of using hot-wire coil filament and using multiple gas inlets to produce high quality semi conductors. The hot-wire coil filament is employed to achieve a most-efficient excitation and/or disassociation of the gas. The gas is directed into the reactor near the coiled filament, thus, achieving a high deposition rate. According to the present invention, at least one suitable reactant gas is directed into the reactor through inlets near the substrates (and not near the filament). This gas can be remotely (i.e., not directly) excited by the gas species which are introduced from inlets near the filament. Such a combination allows for maximum control of reactive species inside the deposition chamber. This method is useful to deposit various films with desirable optoelectronic and mechanical properties that are ideal for use in a broad range of devices.

According to certain methods of the present invention, a-Si thin films are deposited at a rate at least about 400 to at least about 800 A/sec, which is a factor of 100 to 200 times faster than currently used processes.

The hot-wire deposition system of the present invention includes an apparatus for and a method for a hot filament chemical vapor deposition process. The apparatus includes at least one coiled hot filament in a chemical vapor deposition (CVD) chamber. Such a system is useful for the fabrication of high efficiency amorphous silicon based solar cells at a high rate. The hot-wire CVD process is especially useful for the deposition of 1) high quality a-Si (amorphous silicon), and a-SiGe (amorphous silicon germanium) materials at high deposition rates, 2) high quality poly-Si (polycrystalline silicon) and $\mu$c-Si (microcrystalline silicon) films for the narrow bandgap absorber layer, and 3) high-quality diamond-like carbon coatings.

In one aspect, the present invention relates to a method for the deposition of a thin film material on a substrate which includes:

providing a deposition chamber and a substrate in the deposition chamber, applying a vacuum for evacuating the deposition chamber to a sub-atmospheric pressure, heating a dense hot filament to about 1500 C. or higher, introducing at least one first reactant gas into at least one first gas inlet, the first gas inlet being adjacent the dense filament, and introducing at least one second gas into at least one second gas inlet, the at least one second gas inlet being in a spaced apart relationship to the dense filament, and, in certain embodiments, adjacent the substrate.

In another aspect, the method can include at least one further step of heating the substrate to a temperature between about room temperature and about 500 C. or higher to enhance the surface mobility of atoms during film growth in yet another aspect, the invention includes the further step of evacuating the deposition chamber to a sub-atmospheric pressure. In certain embodiments the chamber can be evacuated to a pressure of about $10^{-5}$ Torr or less.

According to certain preferred aspects of the present invention, the dense hot filament can be a densely pack filament coil or other dense filament structure such as, for example, tungsten, tantalum or molybdenum. The suitable reactant gas, or gases, introduced into the evacuation chamber can be one or more of the following: $H_2$, silicon hydrides ($SiH_4$, $Si_2H_6$, $Si_3H_8$, $Si_xH_{(2x+2)}$), silicon fluorides, germanium hydride, germanium fluoride, carbon hydride, carbon fluoride, and the like.

While the embodiments of this invention have been described relating to the use of silane gases, the spirit and scope of the invention is not to be limited to these specific gases. Rather, the list of gases herein is meant as a guide and the invention is not to be limited to these gas precursors but could include other suitable precursors and other combinations as are apparent to those of skill in this art.

In yet another aspect, at least one electrode can be included in the deposition chamber to strike and maintain a plasma for the film deposition. The electrode preferably delivers power at the frequency of 0 (DC) to 150 MHz (VHF) including 13.56 MHz (RF). The plasma can be stricken during the interface treatment, or during simultaneous plasma and hot-filament deposition.

Using the method of the present invention, deposition rates up to at least about 800 A/sec are achieved. In certain embodiments of the present invention, the thin film material is deposited at a rate substantially higher than that of PECVD. Also, in certain embodiments, the deposition rates range from at least about 150 A/sec to about 800 A/sec, and in certain other embodiments, the deposition rates range from about 400 to about 800 A/sec.

The present invention also relates to an apparatus for the deposition of thin film material upon a substrate. The apparatus includes a deposition chamber, a vacuum source for evacuating the deposition chamber to sub-atmospheric pressure, a dense hot filament capable of being heated to 1500 C. or higher, at least one first gas inlet adjacent the dense filament for introducing at least one gas into the evacuated deposition chamber through the first inlet, and at least one second gas inlet in spaced apart relationship from the dense filament for introducing at least one gas into the evacuated deposition chamber through the second inlet. The apparatus can include a means for heating the substrate to a temperature between room temperature and 500 C. or higher to enhance the surface mobility of atoms during film growth. The deposition chamber is capable of being evacuated to a pressure of about $10^{-5}$ Torr or less. In certain embodiments, the dense hot filament comprises a densely pack filament coil or other dense filament structure.

The apparatus can further include at least one electrode in the deposition chamber to strike and maintain a plasma for the film deposition. The electrode preferably delivers power at the frequency of 0 (DC) to 150 MHz (VHF) including 13.56 MHz (RF). The plasma can be stricken during the interface treatment or during simultaneous plasma and hot-filament deposition.

The material made using the apparatus and method of the present invention is useful as an active layer in a photovoltaic material, in a thin film transistor, in an ac color plasma display, and as a hard coating for tools.

DETAILED DESCRIPTION OF THE PREFERRED EMBODIMENTS

Figure 1:
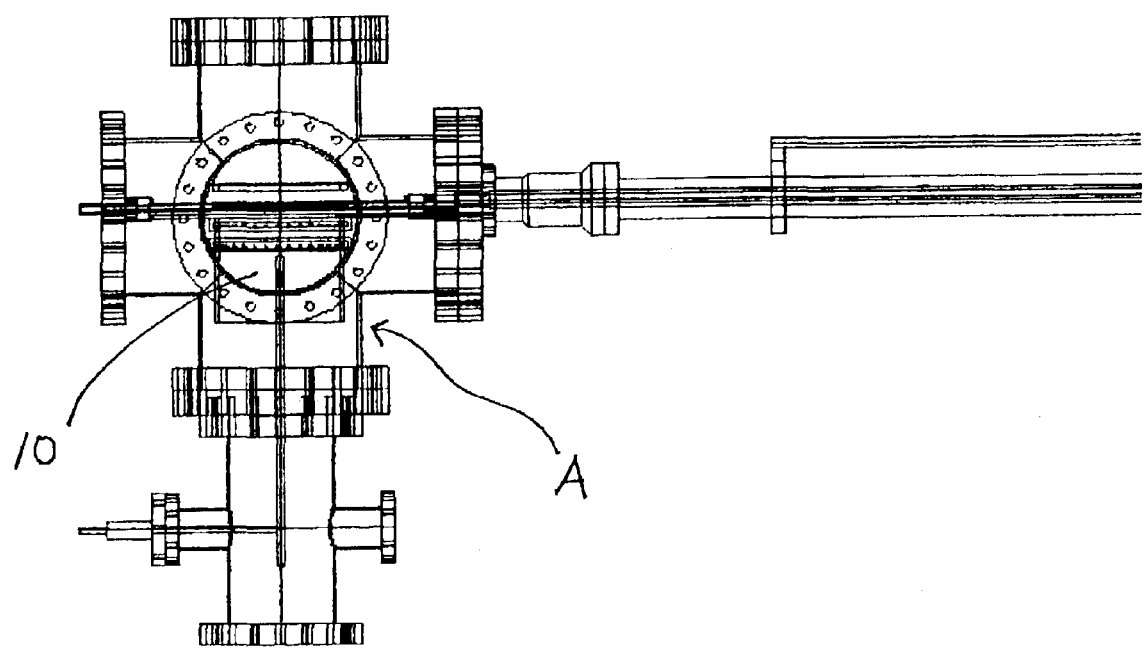
FIG. 1 is a schematic, front view of the hot-wire deposition chamber.
Figure 2:
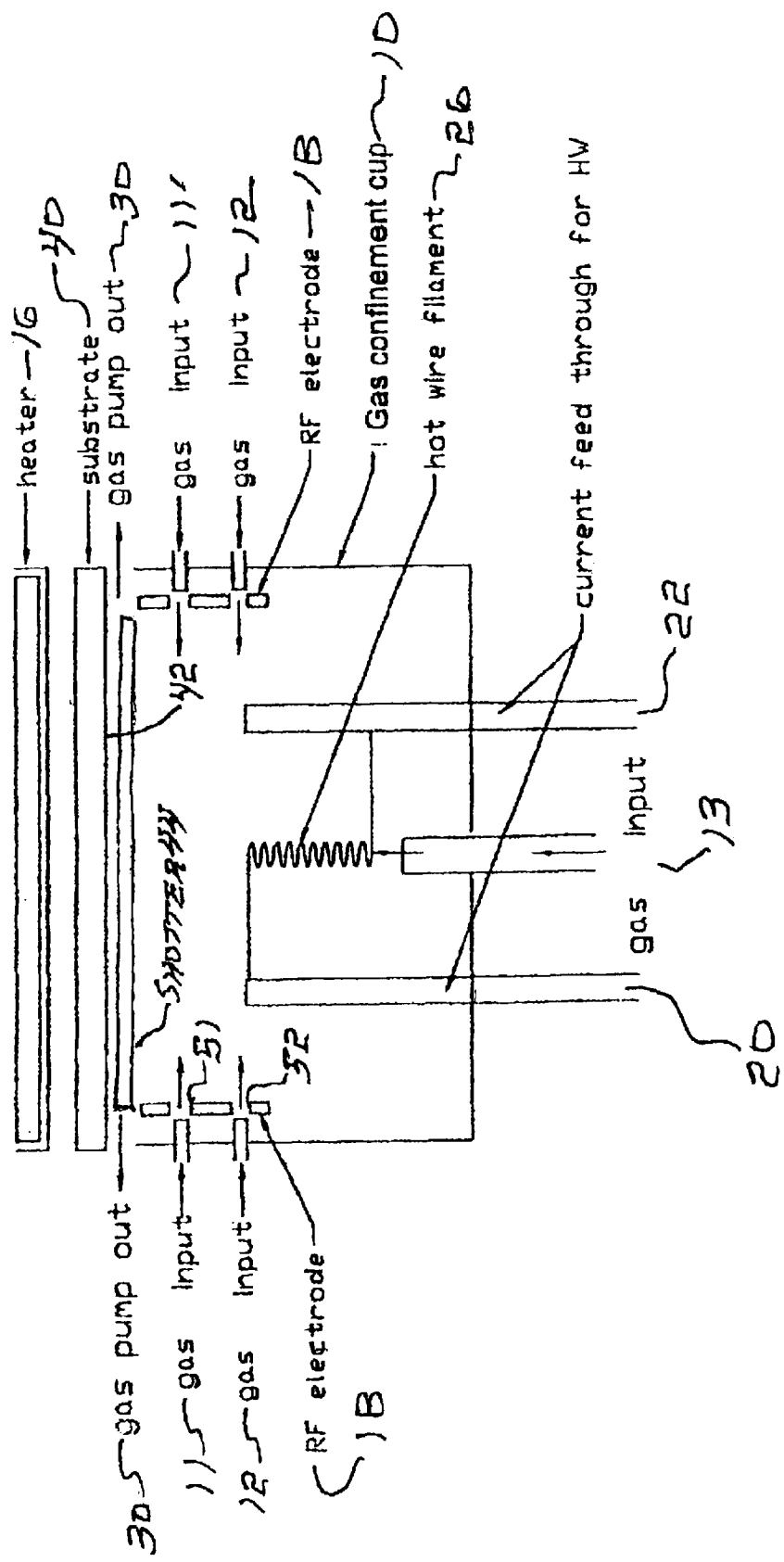
FIG. 2 is a detailed schematic view of a gas confinement cup of the hot-wire deposition chamber of FIG. 1.

Referring to FIG. 1, the deposition chamber A encloses a gas confinement cup 10 shown in detail in FIG. 2.

FIG. 2 is a schematic diagram of the gas confinement cup 10 showing the gas flow pattern through a plurality of gas inlets generally indicated as 11, 12, and 13.

The confinement cup 10 includes a heater 16 and at least one or more RF (radio frequency) electrodes 18. The confinement cup 10 further includes two posts, 20 and 22, which support a hot-wire filament 26. In the embodiment shown, the filament 26 is shown as a coiled filament. It should be understood, however, in other embodiments the filament 26 can have an other suitable dense structure. The posts 20 and 22 allow current to flow from the post 20 through the hot-wire filament 26 and into the opposing post 22, or vice versa. In one embodiment, one or more active gases flow through a bottom inlet 13. These gases pass through the heated filament 26 placed next to the bottom inlet 13 resulting in a most-efficient excitation and/or dissociation of the elements from the filament 26. In the embodiment shown, the inlet 13 is positioned in a spaced apart relationship to the coiled filament 26 such that the inlet 13 is in axial alignment with an axis longitudinally extending through the center space of the coiled filament 26.

The confinement cup 10 further defines one or more gas outlets 30. A substrate 40 which is to be coated is positioned in the confinement cup 10 adjacent the heater 16 and in a spaced apart relationship to the hot-wire filament 26.

The confinement cup 10 allows a high degree of controllability of the reactive species near a surface 42 of the substrate 40. This controllability allows for the growth, or deposition, of high-quality materials onto the substrate 40 at a high rate. In this embodiment, the gas confinement cup is used to guide the flow of gases by using multiple gas inlets.

In certain embodiments, $H_2$ gas is introduced from the bottom gas inlet 13. The gas passes the filament coil 26 and becomes excited or dissociated. A high concentration of atomic hydrogen flows from the filament 26 toward the substrate 40. At least one other gas, such as $Si_2H_6$ gas or $SiH_4$ gas, is injected into the confinement cup 10 through a plurality of gas inlets generally shown as 11 and 11' and 12 and 12', which are preferably spaced and distributed around the circumference of the confinement cup 10 near the substrate 40. In certain embodiments, a shutter 44 is used to protect the substrate 40 during non-deposition periods.

It is to be understood that multiple gas inlets are within the contemplated scope of the present invention and that the drawings are merely schematic illustrations of the present invention. In the embodiment shown, there are two sets of circumferentially spaced gas inlets, each set being a preferred distance from the substrate. In the embodiment shown in FIG. 2, the gas inlets schematically illustrated as 11 and 11' are each spaced at a first distance from the substrate 42 while the gas inlets schematically illustrated as 12 and 12' are each spaced at a second distance from the substrate 42.

It should be further understood that there can be different amounts and types of gases that are discharged through one or more inlets during the deposition process. The amounts and types of gases can be changed to provide the desired film growth on the substrate 42. The filament coil 26 is mounted inside confinement cup 10 and is mounted on the two posts 20 and 22. The position of the filament 26 can be adjusted relative to the substrate 40 to control the flux of gases (such as atomic H and $SiH_3$) onto the growth surface 42 of the substrate 40. In certain embodiments, the resistive heater 16 is used to heat the substrate 40. The heater 16 is connected to a top chamber flange (not shown) through a bellows (not shown). After the substrate 40 is loaded into the confinement cup 10, the bellows is lowered so that the heater 16 and the substrate 40 are in direct contact.

As shown in FIG. 2, the circular RF (radio frequency) electrode 18 (shaped like a circular ribbon) is near the top of the confinement cup 10 and below the substrate 40, but higher than the filament 26. On the RF electrode plate, there are a plurality of holes 51 and 52, lined up respectively with the inlets 11 and 12 on the confinement cup 10. The holes 51 and 52 allow the gases to be injected into the confinement cup 10 from the gas inlets 11 and 12.

The electrodes 18 provide the additional capability of employing a plasma-assisted hot-wire chemical vapor deposition (HWCVD) process. The electrodes are particularly useful for H plasma surface treatments before and after thin film deposition. The sources of process gases, such as $GeH_4$, $Si_2H_6$ and $H_2$, are connected in such a way that each gas flows into the confinement cup 10 from any of the three sets of gas inlets 11, 12, and/or 13. The present invention provides the flexibility to 1) inject different gases, such as $GeH_4$, $Si_2H_6$, together with a desired gas, such as $H_2$ at inlet 13; 2) inject additional $H_2$ from inlets 11 to cover the surface 42 of the substrate 40 with more molecular $H_2$; 3) inject $H_2$ from inlets 11 and $Si_2H_6$ from inlet 13 and conduct a VHF deposition process using a conventional approach; or 4) perform any combinations of the above. In FIG. 2, an outer chamber (main vacuum chamber) is not shown for clarity purposes.

In operation, a method for the deposition of a thin film material is deposited on a substrate as follows: providing a confinement cup and a substrate in the confinement cup, applying a vacuum for evacuating the confinement cup to a sub-atmospheric pressure, heating a dense hot filament to about 1500 C. or higher, introducing at least one first gas inlet near the dense filament into the evacuated confinement cup through the first inlet, and introducing at least a second gas into at least one second gas inlet in a spaced apart relationship to the dense filament. The second gas is introduced into the evacuated confinement cup through the second inlet.

During certain operations, the substrate is heated to a temperature between about room temperature and about 500 C. or higher to enhance the surface mobility of atoms during film growth. Also, in certain operations, the confinement cup is evacuated to a sub-atmospheric pressure by evacuating the confinement cup to a pressure of about $10^{-5}$ Torr or less.

The dense hot filament can be at least one densely pack filament coil or other suitable dense filament structure. The at least one gas introduced into the confinement cup can be one or more of the following: $H_2$, a silicon hydride ($SiH_4$, $Si_2H_6$, $Si_3H_8$, $Si_xH_{(2x+2)}$), silicon fluoride, germanium hydride, germanium fluoride, carbon hydride, carbon fluoride and the like.

In yet another aspect, at least one electrode can be included in the confinement cup to strike and maintain a plasma for the film deposition. The electrode preferably delivers power at the frequency of 0 (DC) to 150 MHz (VHF) including 13.56 MHz (RF). The plasma can be stricken during the interface treatment, or during simultaneous plasma and hot-filament deposition.

According to the present invention, the confinement cup confining the gas keeps the deposition area clean. The multiple gas inlets allow maximum control of the radical concentrations near the growth surface of the substrate. The coil filament next to one of the inlets, allows most-efficient excitation and/or decomposition of the selected gas injected from this particular inlet. An RF/VHF (radio frequency/very high frequency) electrode inside the confinement cup allows sequential and/or simultaneous excitation of growth radicals during deposition. The shutter placed very close to the substrate, provides maximum protection during the transient times.

EXAMPLE

μc-Si:H (μc=microcrystalline) and a-Si:H (a=amorphous) films are deposited using the hot-wire system described above that employs a coiled filament. Process gasses, $H_2$ and $Si_2H_6$, are capable of being directed into the confinement cup 10 via three different gas inlets. Inlet 13 directs the process gas through the coiled filament 26 for efficient dissociation and excitation. Sets of inlets 11 and 12 direct gas into the confinement cup 10, away from the filament 26 via gas dispersal rings (not shown). Gases injected into the inlets 11 and 12 are capable of being get excited remotely by the excited gasses injected through inlet 13.

A first set of Si-based films is deposited at different filament temperatures $T_f$=1500, 1700, 1900 and 2100° C. and substrate temperatures $T_s$=150, 225 and 300° C. while other deposition conditions are kept unchanged (pressure 20 mT, $H_2/Si_2H_6$ flows 3 sccm/3 sccm). Raman back scattering, UV-Visible transmission and IR transmission measurement are taken for these samples. Raman scattering performed on the sample front side reveals that films deposited at $T_s$ of 150 and 225° C. are microcrystalline as indicated from a 519.5 cm$^{-1}$ Raman TO peak, films deposited at 300° C. are amorphous as indicated from a broad 480 cm$^{-1}$ peak. When Raman measurement is taken from the back side of the film through quartz substrates, the films show a broad 480 cm$^{-1}$ peak, indicating amorphous struction during initial deposition on the substrates. The deposition of μc-Si and a-Si depends on the film thickness as well as other deposition conditions.

In the second set, all samples are deposited at $T_s$=225° C. and $T_f$=2100° C. However, four different gas flow schemes are used: both $Si_2H_6$ and $H_2$ from inlets 11 and/or 12; both $Si_2H_6$ and $H_2$ from 13; $Si_2H_6$ from inlet 13 and $H_2$ from inlet 11 and/or 12; and $Si_2H_6$ from inlets 11 and/or 12 and $H_2$ from inlet 13. The front-side Raman scattering of all samples (1~2 μm thick) show predominantly microcrystalline peak at 519 cm$^{-1}$ with a small peak (less than 5% intensity) at around 499 cm$^{-1}$, which may be related to structure with an intermediate-range order. However, when Raman scattering is measured from the back side through glass substrate, samples with both $H_2$ and $Si_2H_6$ directed into the chamber via the same inlet show no microcrystalline Raman peak. Instead, these samples show a broad peak near 490 cm$^{-1}$, as one may relate this to an intermediate-range order. In contrast, for samples with $Si_2H_6$ and $H_2$ directed into the confinement cup via separate inlets, μc-Si peak around 519 cm$^{-1}$ are dominant (with >90% volume fraction) even when measured from the back side of the films, indicating that the initial films on quartz are already μc-Si.

n-i-p solar cells were fabricated on stainless steel substrates using a-Si:H deposited in the hot-wire chamber for the i-layer. Among the preliminary fabricated devices, devices with thick i-layer show efficiency of 7.1% ($V_{oc}$=0.81V, $J_{sc}$=16 mA/cm$^2$, FF=54%) and devices with thin i-layer show efficiency of 2.6% ($V_{oc}$=0.839V, $J_{sc}$=4.51 mA/cm$^2$, FF=68.9%).

The hot-wire deposition process is used to deposit a-Si based films at high deposition rate. Under appropriate deposition conditions, a-Si films could be deposited at a rate up to ~80 nm/s. Table 1 shows the deposition conditions and deposition rate for the film, showing high deposition rates.

Table 1: Deposition conditions of Hot-wire CVD process for depositing a-Si at a rate up to ~80 nm/s.

| Sample Number | Ex 1 | Ex 2 |
| --- | --- | --- |
| Si2H6 flow (sccm) | 105 | 70 |
| Deposition pressure (mTorr) | 115 | 100 |
| Filament temperature (C.) | 1750 | 2000 |
| Substrate temperature (C.) | 300 | 200 |
| Deposition time (sec) | 60 | 60 |
| Film thickness (nm) | 4834 | 2383 |
| Deposition rate (nm/s) | 80.6 | 39.7 |

The foregoing specific objects and advantages and description of the invention are illustrated of those that can be achieved by the present invention and are not intended to be exhausted or limiting of the possible advantages which can be realized. Thus, those and other objects and advantages and embodiments of the present invention will be apparent from the description herein or can be learned from the practicing the invention, both as embodied herein or as modified in view of any variations which may be apparent to those skilled in the art.

We claim:

1. An apparatus for the deposition of thin film material upon a substrate comprising:

a confinement cup;

a vacuum source for evacuating the confinement cup to sub-atmospheric pressure;

a dense hot filament capable of being heated to 1500 C. or higher;

at least one gas inlet adjacent the dense filament for introducing at least one gas into the evacuated confinement cup through the inlet; and at least one gas inlet spaced apart from the dense filament for introducing at least one gas into the evacuated confinement cup through the inlet.

2. The apparatus of claim 1, including a means for heating the substrate to a temperature between room temperature and 500 C. or higher to enhance the surface mobility of atoms during film growth.

3. The apparatus of claim 1, wherein the confinement cup is capable of being evacuated to a pressure of about 10$^{-5}$ Torr or less.

4. The apparatus of claim 1, wherein the dense hot filament comprises a densely pack filament coil or other dense filament structure.

5. The apparatus of claim 1, wherein the at least one gas introduced into the evacuated confinement cup includes at least one of the following: $H_2$, silicon hydride ($SiH_4$, $Si_2H_6$, $Si_3H_8$ and $Si_xH_{(2x+2)}$), silicon fluoride, germanium hydride, germanium fluoride, carbon hydride, and carbon fluoride.

6. The apparatus of claim 1, further including at least one electrode in the confinement cup to strike and maintain a plasma for the film deposition.

7. The apparatus of claim 6, wherein the electrode delivers power at the frequency of 0 (DC) to 150 MHz (VHF) including 13.56 MHz (RF).

8. The apparatus of claim 6, wherein the plasma is stricken during the interface treatment.

9. The apparatus of claim 6, wherein the plasma is stricken for simultaneous plasma and hot-filament deposition.

10. A thin film material deposited on a substrate using the apparatus of claim 1.

11. The material in claim 10 used as an active layer in a photovoltaic device.

12. The material in claim 10 used as an active layer in a thin film transistor.

13. The material in claim 10 used as an active layer in an ac color plasma display.

14. The material in claim 10 used as a hard coating for tools.

* * * * *